United States Patent
Yin et al.

(10) Patent No.: US 6,294,459 B1
(45) Date of Patent: Sep. 25, 2001

(54) ANTI-REFLECTIVE COATINGS AND METHODS FOR FORMING AND USING SAME

(75) Inventors: Zhiping Yin; Gurtej Sandhu, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/146,293

(22) Filed: Sep. 3, 1998

(51) Int. Cl.[7] .................. H01L 21/4763; H01L 21/44; H01L 21/302

(52) U.S. Cl. .................. 438/636; 438/634; 438/680; 438/694

(58) Field of Search .................. 438/634, 636, 438/694, 680; 427/578, 579

(56) References Cited

U.S. PATENT DOCUMENTS

| | | |
|---|---|---|
| 4,764,248 | 8/1988 | Bhattacherjee et al. . |
| 5,194,777 * | 3/1993 | Nakaya et al. .................. 313/509 |
| 5,216,542 | 6/1993 | Szczyrbowski et al. . |

(List continued on next page.)

FOREIGN PATENT DOCUMENTS

| | | |
|---|---|---|
| 61-59820 | 3/1986 | (JP) . |
| 09-134914 | 8/1995 | (JP) . |
| 8-31811 | 8/1996 | (JP) . |
| 8-31812 | 8/1996 | (JP) . |

OTHER PUBLICATIONS

Bencher et al. "Dielectric antireflective coatings for DUV lithography", *Solid State Technology*, pp. 109, 111–112, and 114 (1997).

Wolf et al., *Silicon Processing for the VLSI Era*, vol. 1—Process Technology, Lattice Press, Sunset Beach, CA, 437–441 (1990).

T. Gocho et al., "CVD Method of Anti–Reflective Layer Film for Excimer Laser Lithography", *Int. Conf. On Solid State Devices & Materials*, Makuhari, Aug. 29–Sep. 1, 570–572 (1993).

Heavens, *Optical Properties of Thin Solid Films*, Dover Publications, Inc., New York, NY, 48–49 (1955).

Jenkins et al., *Fundamentals of Optics*, McGraw–Hill Book Company, Inc., New York, NY Section 1.4, 9–10 (1957).

(List continued on next page.)

Primary Examiner—Wael Fahmy
Assistant Examiner—Brook Kebede
(74) *Attorney, Agent, or Firm*—Mueting, Raasch & Gebhardt, P.A.

(57) ABSTRACT

An anti-reflective coating material layer is provided that has a relatively high etch rate such that it can be removed simultaneously with the cleaning of a defined opening in a relatively short period of time without affecting the critical dimensions of the opening. A method of forming such a layer includes providing a substrate assembly surface and using a gas mixture of at least a silicon containing precursor, a nitrogen containing precursor, and an oxygen containing precursor. The layer is formed at a temperature in the range of about 50° C. to about 600° C. Generally, the anti-reflective coating material layer deposited is $Si_xO_yN_z$:H, where x is in the range of about 0.39 to about 0.65, y is in the range of about 0.02 to about 0.56, z is in the range of about 0.05 to about 0.33, and where the atomic percentage of hydrogen in the inorganic anti-reflective coating material layer is in the range of about 10 atomic percent to about 40 atomic percent. The total $SiH_4$ flow is generally in the range of about 80 sccm to about 400 sccm. The gas mixture may include $SiH_4$ and $N_2O$, where the ratio of $SiH_4:N_2O$ is in the range of about 0.25 to 0.60. The inorganic anti-reflective coating material layer may be used for defining contact openings, openings for forming capacitor structures, or any other openings in oxide layers.

20 Claims, 6 Drawing Sheets

U.S. PATENT DOCUMENTS

| | | |
|---|---|---|
| 5,270,241 | 12/1993 | Denison et al. . |
| 5,374,585 | 12/1994 | Smith et al. . |
| 5,418,019 | 5/1995 | Chen et al. . |
| 5,441,914 | 8/1995 | Taft et al. . |
| 5,510,271 | 4/1996 | Rohatgi et al. . |
| 5,539,249 | 7/1996 | Roman et al. . |
| 5,580,815 | 12/1996 | Hsu et al. . |
| 5,639,687 | 6/1997 | Roman et al. . |
| 5,710,067 * | 1/1998 | Foote et al. ............................ 438/636 |
| 6,103,456 * | 8/2000 | Tobben et al. ....................... 430/317 |
| 6,121,133 * | 9/2000 | Iyer et al. ............................ 438/636 |
| 6,124,178 * | 9/2000 | Sung et al. ........................... 438/308 |
| 6,127,262 * | 10/2000 | Huang et al. ......................... 438/634 |

OTHER PUBLICATIONS

Ong et al., "CVD $SiN_x$ Anti–reflective Coating for Sub–0.5μm Lithography", Symposium on VLSI Technology Digest of Technical Papers, pp. 73–74 (1995).

Wolf et al., *Silicon Processing for the VLSI Era*, vol. 1—Process Technology, Lattice Press, Sunset Beach, CA, 437–441 (1990).

Yin, "Chapter 5. Density and Composition of a–$Si_xN_yH_z$ Films," *Optical Properties of Amorphous Silicon Nitride Films*, a dissertation submitted to the Graduate Faculty of The City University of New York, 70–91 (1991).

* cited by examiner

US 6,294,459 B1

ANTI-REFLECTIVE COATINGS AND METHODS FOR FORMING AND USING SAME

FIELD OF THE INVENTION

The present invention relates to the fabrication of integrated circuits. More particularly, the present invention relates to anti-reflective layers used in defining openings in such fabrication.

BACKGROUND OF THE INVENTION

One important process in fabrication of integrated circuits (ICs) is photolithography. Generally, photolithography involves reproducing an image from a mask in a layer of photoresist that is supported by underlying layers of a semiconductor substrate assembly. Photolithography is a very complicated and critical process in the fabrication of ICs. The ability to reproduce precise images in a photoresist layer is crucial to meeting demands for increasing device density.

In the photolithographic process, first an optical mask is positioned between the radiation source and the photoresist layer on the underlying layers of a semiconductor substrate assembly. A radiation source can be, for example, visible light or ultraviolet radiation. Then, the image is reproduced by exposing the photoresist to radiation through the optical mask. Portions of the mask contain an opaque layer, such as, for example, chromium, that prevents exposure of the underlying photoresist. The remaining portions of the mask are transparent, allowing exposure of the underlying photoresist.

The layers underlying the photoresist layer generally include one or more individual layers that are to be patterned. That is, when a layer is patterned, material from the layer is selectively removed. The ability to pattern layers and material enables ICs to be fabricated. In other words, the patterned layers are used as building blocks in individual devices of the ICs. Depending on the type of photoresist used (e.g., positive type or negative type photoresist), exposed photoresist is either removed when the substrate is contacted with a developer solution, or the exposed photoresist becomes more resistant to dissolution in the developer solution. Thus, a patterned photoresist layer is able to be formed on the underlying layers.

One of the problems experienced with conventional optical photolithography is the difficulty of obtaining uniform exposure of the photoresist underlying transparent portions of the mask. It is desired that the light intensity exposing the photoresist be uniform to obtain optimum results.

When sufficiently thick layers of photoresist are used, the photoresist must be or become partially transparent so that photoresist at the surface of underlying layers is exposed to a substantially similar extent as the photoresist at the outer surface. Often, however, light that penetrates the photoresist is reflected back toward the radiation source from the surface of the underlying layers of the substrate assembly. The angle at which the light is reflected is at least in part dependent upon the topography of the surface of the underlying layers and the type of material of the underlying layers. The reflective light density can vary in the photoresist throughout its depth or partially through its depth, leading to non-uniform exposure and undesirable exposure of the photoresist. Such exposure of the photoresist can lead to poorly controlled features (e.g., gates, metal lines, etc.) of the ICs.

In an attempt to suppress reflectivity, or in other words to minimize the variable reflection of light in a photoresist layer, anti-reflective coatings, i.e., anti-reflective layers, have been used between the underlying layers of a substrate assembly and the photoresist layer or between the photoresist layer and the radiation source. Such anti-reflective coatings suppress reflectivity from the underlying substrate assembly allowing exposure across a photoresist layer to be controlled more easily from the radiation incident on the photoresist from the radiation source.

Typically, anti-reflective coatings are organic materials. Organic layers can, however, lead to particle contamination in the integrated circuit (IC) due to the incomplete removal of organic material from the underlying layers after the photolithography step is performed. Such particle contamination can potentially be detrimental to the electrical performance of the IC. Further, the underlying layers upon which the organic materials are formed may be uneven, resulting in different thicknesses of the organic material used as the anti-reflective coating, e.g., thicker regions of organic material may be present at various locations of the underlying layers. As such, when attempting to remove such organic material, if the etch is stopped when the underlying layers are reached, then some organic material may be left. If the etch is allowed to progress to etch the additional thickness in such regions or locations, the underlying layers may be undesirably etched (e.g., punch through of an underlying layer may occur).

Further, inorganic anti-reflective layers have also been introduced for suppressing reflectivity in the photolithography process. For example, silicon-rich silicon dioxide, silicon-rich nitride, and silicon-rich oxynitride have been used as inorganic anti-reflective layers, for example, in the patterning of metal lines and gates.

After a patterned photoresist layer is formed on a substrate assembly, many other processes are typically performed in the fabrication of ICs. For example, the photoresist can act as an implantation barrier during an implant step, the photoresist can be used to define the outer perimeter of an area (e.g., a contact hole) that is etched in one or more underlying layers of the substrate assembly, or the photoresist may be used in any other typically used fabrication process. In many of such cases, the photoresist acts as a barrier during the etching process, such that only selective material of the one or more underlying substrate assembly layers is removed.

After the processes involving photolithographic techniques are carried out (e.g., implantation, etching, etc.), in many circumstances not only must the photoresist material used in the photolithographic process be removed, but the anti-reflective coating must also be removed. For example, in the formation of a container capacitor, such as the container capacitor storage cell described in U.S. Pat. No. 5,270,241 to Denison et al., entitled "Optimized Container Stacks Capacitor DRAM Cell Utilizing Sacrificial Oxide Deposition and Chemical Mechanical Polishing," issued Dec. 14, 1993, a contact opening is defined using photolithographic processes in conjunction with the use of an anti-reflective layer prior to depositing a bottom electrode structure therein. In many cases, the photoresist and the anti-reflective coating used to define the contact opening needs to be removed prior to subsequent processing of the structure.

However, various issues arise during formation of such structures and other integrated circuit structures because of the need to remove the anti-reflective coating. For example, it is important to carry out the formation of integrated circuit structure in the least amount of steps. When anti-reflective coatings need to be removed prior to subsequent processing, an additional step, i.e., the step of removing the anti-reflective coating, is required. For example, the inorganic anti-reflective coatings may be removed in an additional step using suitable etching techniques such as dry etching or reactive ion etching with the use of a fluorine chemistry, e.g., $CHF_3$ or $CF_4$. However, wet etchants are generally more efficient at etching inorganic anti-reflective coating layers than dry etchants. The problem with wet etchants is that such etchants generally etch isotropically and critical dimensions of layers patterned using the anti-reflective coating cannot generally be adequately controlled.

SUMMARY OF THE INVENTION

There is a need for methods of forming and using inorganic anti-reflective material layers. For example, it is desirable to suppress reflectivity with the use of anti-reflective material layers in patterning steps for the formation of integrated circuit structures. The present invention provides various methods for forming inorganic anti-reflective coating material layers and methods for using such inorganic anti-reflective coating material layers in the formation of integrated circuit structures. For example, the present invention provides an anti-reflective coating material layer having a relatively high etch rate such that it can be removed simultaneously with the cleaning of a defined opening in a relatively short period of time without affecting the critical dimensions of the opening.

A method of forming an anti-reflective coating material layer according to the present invention includes providing a substrate assembly having a surface in a reaction chamber. A gas mixture of at least a silicon containing precursor, a nitrogen containing precursor, and an oxygen containing precursor is provided in the reaction chamber. An inorganic anti-reflective coating material layer is deposited on the substrate assembly surface using the gas mixture at a temperature in the range of about 50° C. to about 400° C. The deposition of the inorganic anti-reflective coating material layer includes subjecting the gas mixture to a glow discharge created by applying an electromagnetic field across the gas mixture. Further, the inorganic anti-reflective coating material layer deposited is $Si_xO_yN_z$:H, where x is in the range of about 0.39 to about 0.65, y is in the range of about 0.02 to about 0.56, z is in the range of about 0.05 to about 0.33, and where the atomic percentage of hydrogen in the inorganic anti-reflective coating material layer is in the range of about 10 atomic percent to about 40 atomic percent.

In one embodiment of the method, the silicon containing precursor is $SiH_4$ Further, the nitrogen containing precursor and oxygen containing precursor is $N_2O$.

In another embodiment, the provision of the gas mixture includes providing a total flow of $SiH_4$ in a range of about 80 sccm to about 400 sccm; preferably a total flow of $SiH_4$ is in the range of about 150 sccm to about 400 sccm. Further, the provision of the gas mixture includes providing a flow of $N_2O$ in a range such that the ratio of the total flows of $SiH_4:N_2O$ is in a range of about 0.25 to about 0.60.

In yet another embodiment of the method, the silicon containing precursor is disilane.

Another method of forming an anti-reflective coating material layer according to the present invention includes providing a substrate assembly having a surface in a reaction chamber. A gas mixture of at least $SiH_4$ and $N_2O$ is provided in the reaction chamber. The provision of the gas mixture includes providing a total flow of $SiH_4$ in a range of about 150 sccm to about 400 sccm. The inorganic anti-reflective coating material layer is deposited on the substrate assembly surface in the reaction chamber. The deposition includes subjecting the gas mixture to a glow discharge created by applying an electromagnetic field across the gas mixture.

In one embodiment of the method, the total flow of $SiH_4$ is in a range of about 200 sccm to about 400 sccm. In another embodiment of the method, the temperature of the surface is maintained in the range of about 50° C. to about 600° C. In yet another embodiment of the method, the provision of the gas mixture further includes providing a flow of $N_2O$ in a range such that the ratio of the total flows of $SiH_4:N_2O$ is in a range of about 0.60 to about 0.25.

An anti-reflective coating material layer according to the present invention consists essentially of $Si_xO_yN_z$:H, where x is in the range of about 0.39 to about 0.65, y is in the range of about 0.02 to about 0.56, z is in the range of about 0.05 to about 0.33, and where the atomic percentage of hydrogen in the inorganic anti-reflective coating material layer is in a range of about 10 atomic percent to about 40 atomic percent.

A method for use in fabrication of integrated circuits according to the present invention includes providing a substrate assembly having a surface and providing an oxide layer on the surface of the substrate assembly. Further, an inorganic anti-reflective coating material layer is formed on the oxide layer and a mask layer is provided on the inorganic anti-reflective coating material layer. The mask layer is patterned to define an opening to be formed in the oxide layer. The oxide layer is etched to define the opening in the oxide layer to a region of the surface of the substrate assembly. The opening is defined by at least one wall and the surface region. The mask layer is then removed and the at least one wall and the surface region defining the opening is cleaned with a wet etchant while simultaneously completely removing the inorganic anti-reflective coating material layer.

In one embodiment of the method, the oxide layer is BPSG. Yet further, cleaning the at least one wall and the surface region includes completely removing the anti-reflective coating material layer with less than about 100 angstroms of BPSG being removed.

In another embodiment of the method, the wet etchant cleans the at least one wall and the surface region defining the opening in a time period of less than about 60 seconds while simultaneously completely removing the inorganic anti-reflective coating material layer.

Yet further, in another embodiment, the inorganic anti-reflective coating material layer has a thickness in the range of about 100 Å to about 1000 Å.

A method for use in fabrication of a capacitor structure according to the present invention is also provided. The method includes providing a substrate assembly with the substrate assembly including a conductive contact surface region. An oxide layer is provided on the substrate assembly. Further, an opening is defined through the oxide layer to the conductive contact surface region. The definition of the opening includes forming an inorganic anti-reflective material layer on the oxide layer, forming a mask layer on the inorganic anti-reflective material layer, patterning the mask layer to define the opening in the oxide layer, and etching the oxide layer to define the opening in the oxide layer to the conductive contact surface region of the substrate assembly with the opening defined by at least one wall and the conductive surface region. The mask layer is then removed and the at least one wall and the surface region defining the opening cleaned with a wet etchant while simultaneously completely removing the inorganic anti-reflective material layer. Thereafter, a capacitor electrode is formed in the opening after the opening is cleaned and the inorganic anti-reflective coating material layer is completely removed.

Another method for use in fabrication of integrated circuits according to the present invention includes providing a substrate assembly having an opening defined therein by at least one surface of BPSG. The opening is defined using an inorganic anti-reflective coating material layer with at least a portion of the anti-reflective coating material layer remaining on the substrate after the opening is defined. Thereafter, the inorganic anti-reflective coating material layer is completely removed with less than about 100 angstroms of the at least one surface of BPSG being removed.

In one embodiment of the method, the inorganic anti-reflective coating material layer has a thickness in the range of about 100 Å to about 1000 Å. Further, completely removing the inorganic anti-reflective coating material layer includes cleaning the opening with a wet etchant in a time period of less than about 60 seconds while simultaneously removing the inorganic anti-reflective coating material layer.

Lastly, a method of forming a contact opening according to the present invention includes defining a contact opening in an oxide layer using an inorganic anti-reflective coating material layer. The contact opening extends to a conductive contact surface area. A portion of the inorganic anti-reflective coating layer remains after the contact opening is defined. Thereafter, the portion of the inorganic anti-reflective coating material layer is completely removed while cleaning the opening with less than about 100 angstroms of the oxide layer being removed.

In one embodiment of the method, the oxide layer is BPSG or rich BPSG. Further, the inorganic anti-reflective coating material layer may have a thickness in the range of about 100 Å to about 1000 Å and a wet etchant is used to clean the opening in a time period of less than about 60 seconds while simultaneously removing the inorganic anti-reflective coating material layer.

DETAILED DESCRIPTION OF THE EMBODIMENTS

The present invention shall be generally described with reference to FIGS. 1A–1D. Thereafter, embodiments and illustrations of applications using the present invention shall be described with reference to FIGS. 2A–2D and FIGS. 3A–3D. It will be apparent to one skilled in the art that scaling in the figures does not represent precise dimensions of the various elements illustrated therein.

To provide better controlled photolithography when forming integrated circuit (IC) structures, inorganic anti-reflective coating (ARC) layers (otherwise referred to as dielectric anti-reflective coatings (DARC)) are used. Using such inorganic anti-reflective material layers results in uniform exposure of photoresist which has been formed on underlying layers of a substrate assembly due to at least in part suppression of reflectivity from the underlying layers of the substrate assembly. Thus, well-defined patterns are able to be reproduced in the photoresist. Forming well-defined patterns in the photoresist leads to well-defined patterning of underlying material. As device density is increasing in integrated circuit structures, such precise definition is becoming increasingly important.

It is to be understood that the term substrate assembly, as used herein, includes a wide variety of semiconductor-based structures, including but not limited to semiconductor substrates and semiconductor substrates having one or more layers or regions formed thereon or therein. Semiconductor substrates can be a single layer of material, such as a silicon wafer, or it is understood to include silicon-on-sapphire (SOS) technology, silicon-on-insulator (SOI) technology, doped and undoped semiconductors, epitaxial layers of silicon supported by a base semiconductor, as well as other semiconductor substrate structures. When reference is made to a semiconductor substrate assembly in the following description, various process steps may have been used to form regions/junctions in a semiconductor substrate or may have been used to form one or more layers or regions of material relative to the substrate.

Figure 1A:
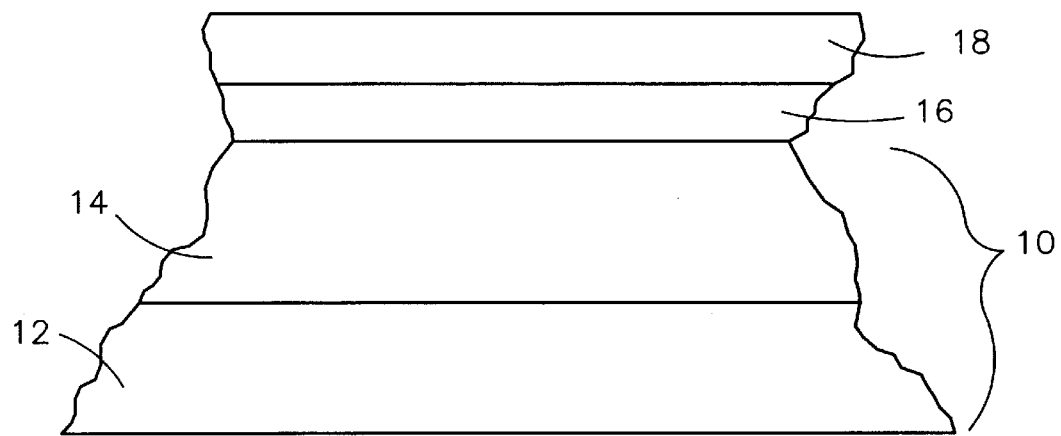
FIGS. 1A–1D generally illustrate the process of patterning and etching an opening in a layer using an inorganic anti-reflective material layer; the anti-reflective material layer is removed during the process.

FIGS. 1A–1D generally illustrate a method of defining an opening 24 (FIG. 1D) in a layer 14 of a substrate assembly 10 according to the present invention. As shown in FIG. 1A, substrate assembly 10 includes a substrate assembly portion 12 and a layer 14 formed thereon. For example, substrate assembly 10 may be a structure in which an opening is defined for formation of a capacitor. In such a case, for example, the substrate assembly portion 12 may include a polysilicon containing region for connection to a bottom electrode of a storage cell capacitor as described with reference to FIGS. 2A–2D. The layer 14 formed on the substrate assembly portion 12 may be an insulative layer such as an oxide layer, e.g., silicon dioxide, borophosphosilicate glass (BPSG), phosphosilicate glass (PSG), etc.

Further, for example, the substrate assembly portion 12 may include a source and/or drain region to which a contact is being made through an insulative layer 14, such as an oxide layer, e.g., silicon dioxide, BPSG, PSG, etc. As such, a contact opening to a region of substrate assembly portion 12 would be defined to be used for forming a contact interconnect using a conductive material to the source/drain region, such as described with reference to FIGS. 3A–3D herein.

The anti-reflective coating materials described herein and the methods for using such anti-reflective materials may be used for any application requiring photolithographic processing. However, the present invention is particularly beneficial for use in defining openings such as contact holes or vias through an insulating layer to underlying material, defining trenches, defining openings for formation of cell electrodes, etc.

More particularly, the present invention may be beneficial for the definition of small aspect ratio openings having feature sizes or critical dimensions below about 1 micron (e.g., such as width of an opening being less than about 1 micron) and aspects ratios greater than 1. Such critical dimensions and aspect ratios are applicable to contact holes, vias, trenches, and other configured openings. For example, a trench having an opening width of 1 micron and a depth of 3 microns has an aspect ratio of 3.

Figure 1B:
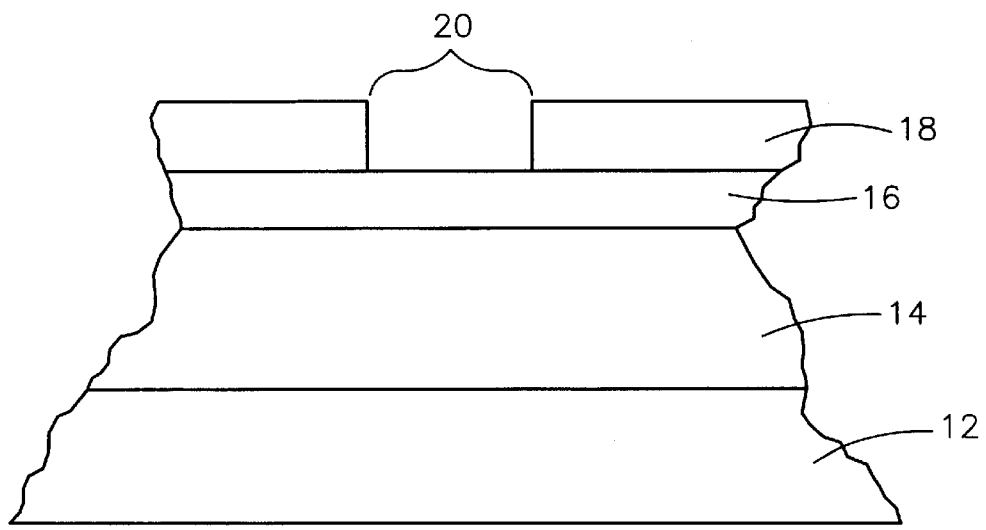
Figure 1C:
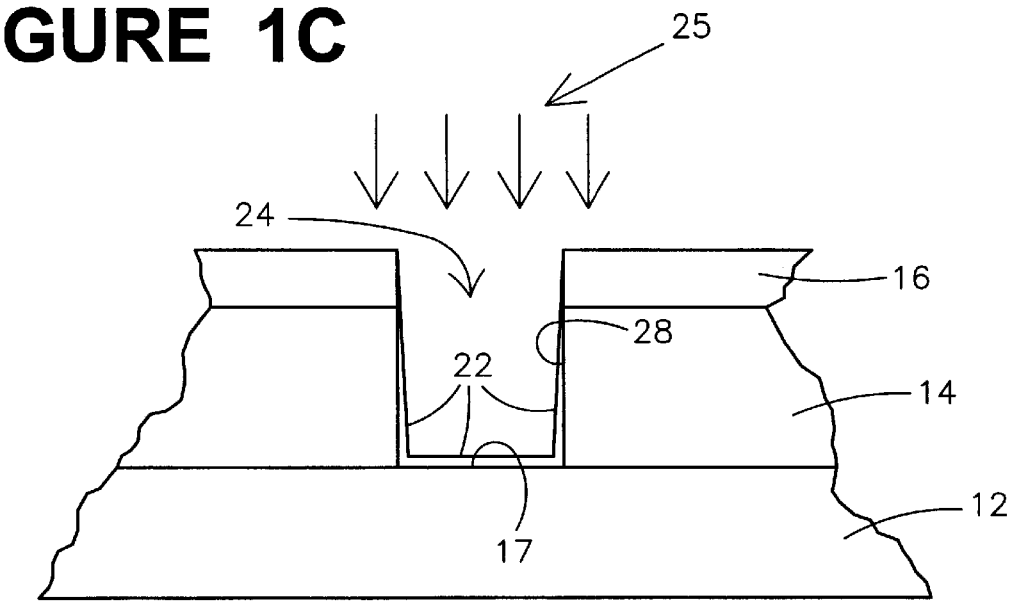
Figure 1D:
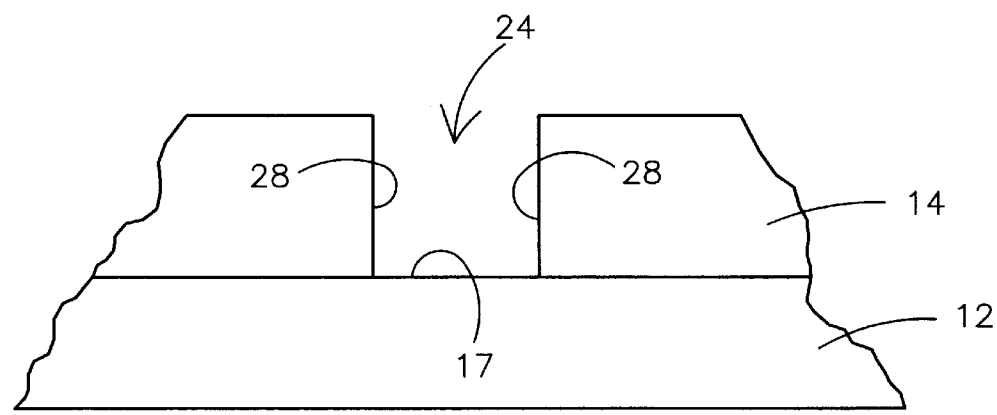

A method of defining an opening in an oxide layer is generally shown in FIGS. 1A–1D. As previously described, with reference to FIG. 1A, an oxide layer 14 is formed on substrate assembly portion 12 for use in the formation of one or more integrated circuit structures. The opening 24 as shown in FIG. 1D is then defined in the oxide layer 14. The oxide layer may be formed of silicon dioxide, BPSG, PSG, or any other oxide or insulating material as would be known to one skilled in the art. In preferred embodiments, the oxide layer 14 may be a BPSG layer, wherein the percentage of boron is in the range of about 3 percent to about 5 percent by weight and the percentage of phosphorous is in the range of about 6 percent to about 8 percent by weight, or the oxide layer 14 may be a rich BPSG layer, wherein the percentage of boron is in the range of about 3.8 percent to about 4.2 percent by weight and the percentage of phosphorous is in the range of about 6.8 percent to about 7.4 percent by weight.

An inorganic anti-reflective coating material layer 16 is then formed over the oxide insulating layer 14 for suppressing reflectivity from the substrate assembly 10 during the photolithography process used to define opening 24. The inorganic anti-reflective coating material layer 16 is formed such that the anti-reflective coating material layer 16 has a thickness in the range of about 100 angstroms to about 1000 angstroms. Preferably, the anti-reflective coating material layer 16 is a high etch rate material layer and can be removed in a time period of less than 60 seconds, more preferably in a time period less than about 45 seconds, using a wet etchant. With use of such an anti-reflective coating material layer 16, the anti-reflective coating material layer 16 can be removed at the same time as the structure defining opening 24 is cleaned. As such, an additional step is not required to remove the anti-reflective coating material layer 16. Also, preferably, the wet etch used to remove the inorganic anti-reflective coating material layer 16 removes the entire inorganic anti-reflective coating material layer 16 with less than about 100 angstroms of BPSG being removed from sidewalls 28 of the opening 24. Methods of forming such a high etch rate material layer shall be described in further detail below.

Further, as shown in FIG. 1A, to define opening 24, a resist layer, e.g., a negative or positive type photoresist, is formed over the anti-reflective coating material layer 16. The photoresist layer 18 may be any suitable photoresist usable in general photolithography processes. For example, the photoresist may be a deep ultraviolet (DUV) resist, mid-ultraviolet (MUV) resist, or any other resist used in photolithography processing.

As shown in FIG. 1B, the photoresist 18 is patterned using conventional photolithography. For example, using a suitable mask, DUV resist may be exposed to wavelengths of about 248 nanometers or other types of resist may be exposed to wavelengths of about 365 nanometers. Thereafter, the photoresist is contacted with a developer solution and the photoresist is selectively removed from the substrate assembly 10 according to the pattern exposed therein. Opening 20 in the photoresist layer 18 results from the photolithography process and defines the area of the substrate assembly to be removed for attaining the desired structure. In other words, the opening 20 defines the area of the oxide layer 14 which is to be etched to define opening 24 therethrough as shown in FIG. 1D.

One skilled in the art will recognize that any photolithograph process for patterning the resist and underlying layers may be used according to the present invention. However, depending on the parameters of the photolithography process, the characteristics of the anti-reflective coating material layer 16 will change accordingly. For example, the composition of the layer 16 and thickness of the layer 16 may vary depending upon whether DUV resist exposed to wavelengths in the 248 nanometer region or resist exposed to wavelengths in the 365 nanometer region are used. This is at least in part due to the different reflectivity properties required for the layer 16 in different photolithographic processes.

After the photoresist has been selectively removed to pattern the oxide layer 14, a suitable dry etch is used to etch the opening 24 in the oxide layer 14 down to surface region 17 of the substrate assembly portion 12. The dry etch of the opening 24 is performed using different chemistries for different applications. Preferably, a dry etch is used due to the ability of dry etchants to etch isotropically and as such critical dimensions can be controlled. One example of a chemistry used for the removal of an oxide layer, e.g., a rich BPSG layer, would include the use of a fluorine chemistry, such as $CHF_3$, $SF_6$, or $CF_4$. The dry etch removes portions of the anti-reflective coating material layer 16 patterned by the photoresist layer 18, in addition to the etching of the oxide layer 14 to define the opening 24.

The opening 24 is etched through the oxide layer 14 to surface region 17 of the substrate assembly portion 12. For example, this surface region 17 may be a polysilicon containing region such as in the case where a capacitor electrode structure is formed in the opening, the surface region 17 may be a silicon-containing region such as in the formation of a contact to a source or drain region of a transistor, or may be any other surface region to which an opening is typically etched.

After the opening 24 has been etched in the oxide layer 14, the photoresist layer 18 is removed resulting in the structure as shown in FIG. 1C. The photoresist may be removed using any suitable process, such as an oxygen ash process, e.g., an oxygen containing plasma.

Generally, as shown in FIG. 1C, residue material 22 on the structure defining the opening 24 results from the etching process of the opening 24 in the oxide layer 14 and the removal of the patterned photoresist layer 18. For example, such material 22 may be a polymeric residue, or any other material typically resulting on bottom surface regions 17 and/or side wall surfaces 28 of openings defined in such etching processes. To proceed with subsequent processing (e.g., formation of a conductive material within the opening, silicidation of surface region 17, etc.), the bottom surface region 17 and/or side walls 28 defining opening 24 are required to be cleaned. Generally, a wet etchant 25 is used for a relatively short period of time to remove such material 22. However, overetching to remove such material must be avoided to maintain desired critical dimensions. For example, critical dimensions in an opening formed of an oxide material, e.g., BPSG, should be maintained. Further, for example, a wet clean solution 25 used to remove such material 22 wherein an opening is formed in an oxide material such as BPSG may include HF based solutions such as the super Q solution (40% by weight $NH_4F$ and 4% by weight $H_3PO_4$) available from Olin Hunt, or the wet clean solution 25 may be a solution sold under the trade designation QE-2 (40% by weight $NH_4F$ and 1.2–1.3% by weight $H_3PO_4$) also available from Olin Hunt. Preferably, the components of the HF based solutions include a fluoride salt and a mineral acid, such as $NH_4F$ and $H_3PO_4$. More preferably, the solution is an aqueous solution including 30% to 40% by weight $NH_4F$ and 1% to 5% by weight $H_3PO_4$. One skilled in the art will recognize that the wet etchant used will depend on the material being etched. For example, if the anti-reflective coating material layer 16 is to be simultaneously removed with the residue material 22 while being selective to an underlying layer of a material other than an oxide layer, then a different solution may be used.

In order to reduce the number of processing steps in integrated circuit structure formation processes, it is desirable to remove the anti-reflective coating material layer 16 simultaneously with the residue material 22 which needs to be cleaned from the bottom surface region 17 and walls 28 defining opening 24. As described above, the anti-reflective coating material layer 16 is formed in a manner such that such simultaneous removal of both the anti-reflective coating material layer 16 and residue material 22 from such surfaces defining opening 24 can be accomplished. The cleaning of the surfaces, e.g., walls 28 and 17, using the wet etchant 25 is generally performed in a very short period of time, less than about 60 seconds and preferably less than about 45 seconds, such that oxide material of layer 14 is not removed, i.e., overetching is prevented. If the wet etchant 25 is used for a longer time period, too much of the oxide layer 14 may be removed from the walls 28 or bottom surface region 17 defining the opening 24 resulting in a critical dimension for the opening 24 which is larger than desired. Therefore, it is undesirable to wet etch for a longer time period than about 60 seconds.

If the patterned anti-reflective coating material layer 16 is to be removed simultaneously with the cleaning of residue material 22 of the opening 24, then the anti-reflective coating material layer 16 must also be removed within these time constraints. Therefore, there must be a high selectivity of the wet etchant for etching the anti-reflective coating material layer 16 relative to the oxide layer 14, e.g., rich-BPSG. Preferably, the anti-reflective coating material layer 16 is completely removed with less than 100 angstroms of BPSG being removed. To increase the etch rate for the anti-reflective coating material layer 16 relative to the oxide layer 14, the anti-reflective coating material layer 16 generally has a density that is less than conventional densities for conventional anti-reflective coating material layers.

The reduced density of the anti-reflective coating material layer 16 which results in a high etch rate anti-reflective coating material, can be achieved in a number of manners by various processing techniques as described further below. Generally, the anti-reflective coating material layer 16 is formed with a thickness in the range of about 100 angstroms to about 1000 angstroms. Preferably, the anti-reflective coating material is an inorganic material. The preferred inorganic anti-reflective coating materials are preferably formed between the photoresist layer 18 and the underlying layers of the substrate assembly 10 for use in photolithography processes. Suitable anti-reflective coating materials include an anti-reflective material having the preferred chemical formula $Si_xO_yN_z$:H. Preferably, x is in the range of about 0.39 to about 0.65, y is in the range of about 0.02 to about 0.56, and z is in the range of about 0.05 to about 0.33. More preferably, x is in the range of about 0.40 to about 0.65, y is in the range of about 0.25 to about 0.56, and z is in the range of about 0.05 to about 0.15. It is believed that the incorporation of hydrogen into the layer 16 reduces the density of the layer 16. Therefore, to achieve a reduced density layer, it is preferred that the atomic percentage of hydrogen content of the anti-reflective coating material is in the range of about 10 atomic percent to about 40 atomic percent. It is believed that conventional anti-reflective coating materials generally have an atomic percentage of hydrogen of less than about 10 atomic percent.

Further, suitable anti-reflective coating materials generally have an index of refraction (n) in the range of about 1.7 to about 2.7 at a wavelength of about 248 nanometers or at a wavelength of about 365 nanometers. Further, the absorptive coefficient (k) of suitable anti-reflective coatings material is preferably in the range of about 0.01 to about 1.5 at a wavelength of about 248 nanometers or at a wavelength of about 365 nanometers. Preferably, the index of refraction is in the range of about 1.7 to about 2.1 for a wavelength of about 248 nanometers and in the range of about 1.9 to about 2.5 for a wavelength of about 365 nanometers. Further, preferably, the absorptive coefficient is in the range of about 0.07 to about 0.90 at a wavelength of about 248 and in the range of about 0.01 to about 0.4 for a wavelength of about 365. The refractive index and absorptive coefficient required for processing depends on the index of refraction and the absorptive coefficient of the photoresist used and the other underlying layers of the substrate assembly upon which the photoresist is formed, as well as the dimensions of the underlying substrate assembly features and layers. Depending on the wavelength, as the amount of silicon in a non-stoichiometric anti-reflective coating material increases, the index of refraction and the absorptive coefficient of the anti-reflective coating material typically increases as well. For example, this is generally the case for a wavelength of about 365 nanometers relative to 248 nanometers.

The anti-reflective coating material layer 16 is formed on substrate assembly 10 according to the present invention using chemical vapor deposition (CVD). Preferably, plasma-enhanced chemical vapor deposition (PECVD) is used. PECVD allows formation of the layer 16 at relatively low temperatures in the range of about 50° C. to about 400° C. PECVD processes are used such that lower temperatures can be accomplished because lower temperatures provide a reduced density for the anti-reflective coating material layer as shall be described further below. By controlling the parameters of the PECVD process, anti-reflective coating material of the desired stoichiometry can be formed on the substrate assembly 10. The anti-reflective coating material layer 16, having a thickness of between 100 angstroms to 1000 angstroms, must be capable of being removed in less than 60 seconds, preferably less than 45 seconds. Therefore, the processing parameters and techniques for solving the problem of forming such a reduced density anti-reflective coating material layer are of particular importance.

The steps according to the present invention using plasma-enhanced chemical vapor deposition are carried out in a PECVD reactor, such as a reactor chamber available from Genus, Inc., Applied Materials, Inc., or Novelus, Inc. However, any reaction chamber suitable for performing PECVD may be used.

In PECVD processes, the reacting gases are introduced into the reaction chamber which is at a relatively low pressure (i.e., low compared to ambient pressure). The reaction chamber is evacuated, such as by vacuum pumps, to remove undesirable reactive species. Then a reactant gas mixture including the reacting gases are admitted into the chamber. This is accomplished by one of various techniques. For example, the introduction into the chamber may be accomplished with the use of compounds which are gases at room temperature. It should be readily apparent that the techniques used for introduction of the compounds into the chamber may be varied and that the present invention is not limited to any particular technique or reaction chamber. Typically, the reacting gases are admitted into the chamber at separate inlet ports. In addition to the reactive species, a dilution gas may be flowed into the chamber. For example, helium may be flowed into the chamber at a varied flow rate so as to assist in providing uniformity to the layer being formed. In PECVD, a plasma is created by applying an electric field across the reacting gas mixture containing the reacting gases. The plasma adds energy to the reaction to draw the reaction to completion. Generally, use of a plasma process allows the substrate assembly to be kept at a somewhat lower temperature than other CVD processes. Any suitable power source may be used to generate the plasma in the reaction chamber. Suitable power sources include an RF generator, a microwave (e.g., 2.5 gigahertz microwave source) generator, or an electron cyclotron resonance (ECR) source. The preferred power source is an RF generator operating as a standard 13.56 MHz source.

The anti-reflective coating material layer 16, i.e., the layer of $Si_xO_yN_z$:H, is formed by flowing a silicon-containing precursor gas, an oxygen-containing precursor gas, and a nitrogen-containing precursor gas into the reaction chamber. Generally, an inert dilution gas (e.g., helium or argon) is used as well. Preferably, the silicon-containing precursor gas may be any member of the silane family (e.g., silane, disilane, dichlorosilane, methelsilane, etc.). Preferably, the oxygen-containing precursor gas and the nitrogen-containing precursor gas are a single gas selected from the group of nitrous oxide ($N_2O$), NO, $N_2O_2$, and $NO_2$ or a combination thereof; preferably the gas is $N_2O$. However, the nitrogen-containing precursor and oxygen-containing precursor may be provided as separate gases. When such precursors are separate gases, the oxygen-containing precursor may be selected from $O_2$, $O_3$, $N_2O$, NO, $N_2O_2$, and $NO_2$, or a combination thereof. The nitrogen-containing precursor may be selected from $N_2O$, NO, $N_2O_2$, $NO_2$, ammonia ($NH_3$), nitrogen ($N_2$), or a gas from the family of $[C_nH_{2n+1}]_2NH$, (e.g., $[CH_3]_2NH$), or a combination thereof.

Preferably, the silicon-containing precursor gas is silane ($SiH_4$) and the single oxygen and nitrogen-containing precursor gas is nitrous oxide ($N_2O$). Preferably, to obtain the high wet etch rate anti-reflective coating material layer 16 using silane and nitrous oxide (and in addition, preferably He), the temperature of the PECVD process is reduced to the range of about 50° C. to about 400° C. Generally, lower temperatures are preferred. With lower temperatures in the lower portions of the range described above, higher etch rate anti-reflective coating layers 16 can be created. It is believed that with the use of such lower temperatures, the high etch rate layers incorporate a higher hydrogen content in the film, thus allowing for faster etching. Preferably, the temperature for the process is in the range of about 50° C. to about 400° C. More preferably, the temperature is in the range of 200° C. to 400° C.; however, because of temperatures required for other process steps, a temperature of about 400° C. is typically used. As described further below, higher temperatures, i.e., greater than 400° C., can be used when higher total flow rates of silane are used to form the higher etch rate anti-reflective coating layers.

To obtain desired anti-reflective coating material reflective properties, a fixed flow ratio of silane to nitrous oxide (silane:nitrous oxide) is required. Preferably, this fixed flow ratio of the total silane flow to total nitrous oxide flow (silane:nitrous oxide) is in the range of about 0.60 to about 0.25. Preferably, the pressure of the PECVD process is about 3.5 torr to about 6.5 torr. Further, preferably, the reacting gas mixture is subjected to a glow discharge or a plasma created by applying a radiofrequency electromagnetic field of 13.56 MHz at a power density of about 50 watts/cm$^2$ to about 500 watts/cm$^2$ across the reacting gas mixture. Preferably, the power density is in the range of about 80 watts/cm$^2$ to about 140 watts/cm$^2$ across the reacting gas mixture.

Preferably, the total flow of silane is in the range of about 80 sccm to about 400 sccm. The wet etch rate for the anti-reflective coating material layer 16 may be increased by increasing the total silane flow into the reaction chamber. Therefore, more preferably, the upper portion of the range of total silane flow greater than 150 sccm is preferred. At total flow rates for silane greater than 150 sccm, temperatures greater than 400° may be use to form the high etch rate anti-reflective coating material layers. More preferably, the range of about 200 sccm to about 350 sccm is used to reduce density of the layer 16. However, it must be remembered that a fixed ratio of flows of silane to nitrous oxide is required to get the desired anti-reflective coating material reflection properties. Therefore, with an increase in total silane flow, an increase in nitrous oxide flow must be effected. For example, if 80 sccm of silane in conjunction with a 140 sccm of nitrous oxide provides desired anti-reflective coating material properties, then if the total silane flow is increased to 120 sccm, the flow of nitrous oxide must be increased to 210 sccm.

As described above, it should be clear that in formation of high etch rate anti-reflective coating material layers according to the present invention, temperature and total flow rate of silane are controlled. For example, at lower temperatures, e.g., less than about 400° C., lower flow rates of silane can be used to obtain desired anti-reflective coating material layers, e.g., flow rates as low as 80 sccm. Further, for example, at higher temperatures, e.g., greater than about 400° C., higher flow rates of silane, e.g., greater than 150 sccm, are used to obtain desired anti-reflective coating material layers.

Preferably, the deposition rate for the anti-reflective coating material layer 16 increases with the increase in total flow of silane and nitrous oxide leading to a reduced density layer 16. However, an increase in total flow of silane and nitrous oxide to obtain a high etch rate anti-reflective coating material layer must be weighed against having too high of a deposition rate. Deposition rates above certain levels decrease uniformity and process stability. Further, in addition, such deposition rates require the use of higher flows which use an undesirably large amount of flow gases. Preferably, the total flow of silane and nitrous oxide is used such that the deposition rate for the anti-reflective coating material layer 16 is in the range of 30 angstroms per second to about 110 angstroms per second. In addition, reduced power can also be used to reduce deposition rates.

If a higher level of nitrogen is desired in the anti-reflective coating material layer 16, in order to increase the wet etch selectivity, then an additional optional nitrogen-containing precursor gas may be used in the PECVD process. For example, such additional nitrogen-containing precursor gases may be selected from $NH_3$, $N_2$, or a gas from the family of $[C_nH_{2n+1}]_2NH$. The flow of such a nitrogen-containing precursor is preferably in the range of about 60 sccm to about 500 sccm. Further, a dilution gas such as helium, argon, or any other inert gas may be used to help promote uniformity of the anti-reflective coating material layer 16. For example, the flow of such a dilution gas is preferably in the range of about 1500 sccm to about 2500 sccm.

As an alternative to using silane as the silicon-containing precursor, disilane may be used. With the use of a flow of disilane as opposed to silane, because of the higher hydrogen content of disilane, more hydrogen may be incorporated into the anti-reflective coating material layer 16. As a higher hydrogen content generally results in a higher wet etch rate layer, i.e., a reduced density, disilane may provide additional benefit over the use of silane.

In one particular PECVD process for forming an anti-reflective coating material layer 16 according to the present invention, the process parameters fall within the following approximate ranges:

| | |
|---|---|
| Plasma power: | 50 watts/cm$^2$ to 300 watts/cm$^2$ |
| Temperature: | 50° C. to 600° C. |
| Total silane flow: | 150 sccm to 400 sccm |
| Flow Ratio of silane:nitrous oxide | 0.60 to 0.25 |
| Pressure: | 3.5 torr to 6.5 torr |
| Helium flow: | (Optional): 1500 sccm to 2500 sccm |
| Additional nitrogen precursor flow: | 60 sccm to 500 sccm |

The above processing conditions produce an unexpectedly high wet etch rate anti-reflective coating material layer 16. The anti-reflective coating material layer 16 formed under such parameters is easily etched within the time constraints less than 60 seconds for cleaning an etched opening 24 with a wet etchant, wherein the wet etchant may be the Super Q wet etchant or the QEII wet etchant. This is particularly true when the opening 24 is etched in a layer 14 of rich-BPSG (i.e., boron content in the range of about 3.8 percent to about 4.2 percent by weight, and phosphorous content in the range of about 6.8 percent to about 7.4 percent by weight).

Two illustrations of using the above described anti-reflective coating material layer 16 described in detail above are described below with reference to FIGS. 2A–2D and FIGS. 3A–3D. In each case, the anti-reflective coating material layer is removed simultaneously with the cleaning of an opening defined using the layer. The use of the anti-reflective coating material layer according to the present invention is described with reference to FIGS. 2A–2D wherein a high dielectric capacitor structure of a storage cell is formed. Further, the anti-reflective coating material layer according to the present invention is described with reference to FIGS. 3A–3D wherein a contact structure is described. For simplicity purposes, the descriptions herein are limited to the use of the anti-reflective coating material layer in these two illustrative structures. There are other semiconductor processes and structures for various devices, e.g., CMOS devices, memory devices, etc., that would benefit from the present invention and in no manner is the present invention limited to the illustrative embodiments described herein, e.g., a contact structure and a capacitor structure. For example, the present invention may be used with any fabrication process wherein an anti-reflective coating material layer is to be removed in a predetermined amount of time, preferably in processes which require that such an anti-reflective coating material layer be removed in a time less than about 60 seconds.

Figure 2A:
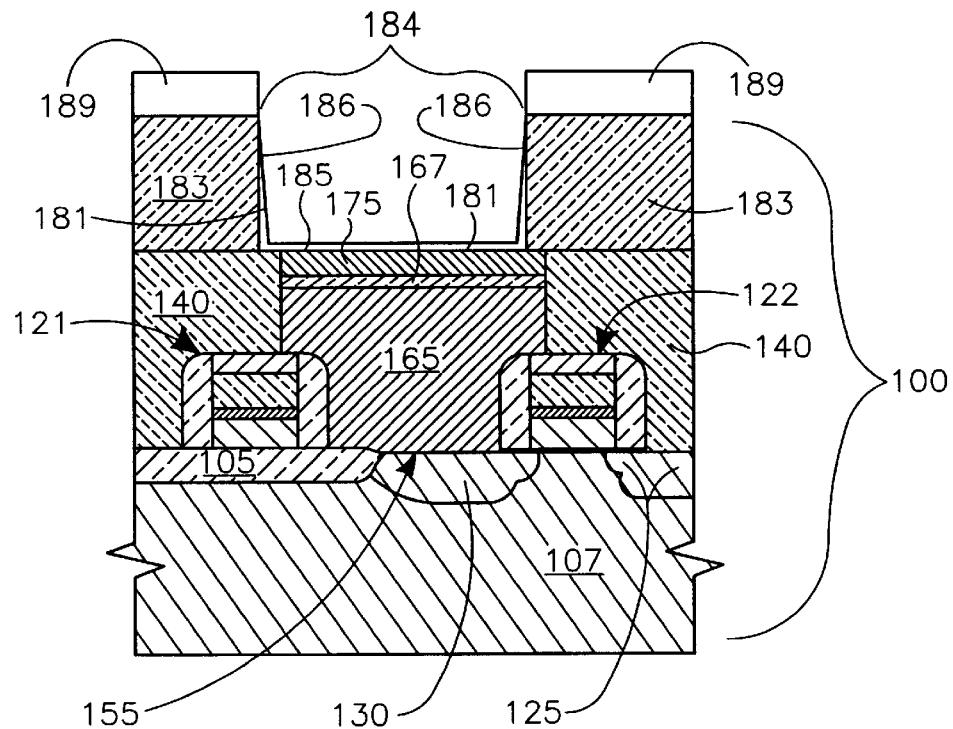
FIGS. 2A–2D illustrate the formation of a capacitor structure using an anti-reflective layer in the definition of an opening; the anti-reflective material layer being removed during the process.

As shown in FIG. 2A, a device structure 100 is fabricated according to the present invention. As such, an opening 184 is defined using an anti-reflective coating material layer 189 according to the present invention. Such processing is performed prior to depositing a bottom electrode structure 187 on the surfaces defining the opening 184. As shown, and as further described in U.S. Pat. No. 5,392,189 to Fazan et al., the device structure 100 includes field oxide regions 105 and active regions, i.e., those regions of the substrate 107 not covered by field oxide. A word line 121 and a field effect transistor (FET) 122 is formed relative to field oxide regions 105 in the active regions. Suitable source/drain regions 125, 130 are created in silicon substrate 107. An insulative conformal layer of oxide material 140 is formed over regions of FET 122 and word line 121. A polysilicon plug 165 is formed to provide electrical communication between the substrate 107 and a storage cell capacitor to be formed thereover. Various barrier layers may be formed over the polysilicon plug 165, including layers 167 and 175. For example, such layers may be titanium nitride, tungsten nitride, or any other metal nitride which act as a barrier or other conductive layers. Thereafter, another insulative layer 183 is formed and the opening 184 is defined therein using the anti-reflective coating material layer 189 according to the present invention as described elsewhere herein. Prior to forming a storage cell capacitor in the opening 184, the bottom surface 185 and one or more side walls 186 defining opening 184 are cleaned of residue material 181 using a wet etchant such as one previously described herein. Simultaneously with the cleaning of the opening 184, the anti-reflective coating material layer 189 is removed without affecting the critical dimensions of the opening 184. For example, the insulative layer 183 may be a rich-BPSG layer and the anti-reflective coating material layer 189 may be formed in accordance with the PECVD process conditions given using silane and nitrous oxide as the gas precursors. The resultant structure after cleaning the residue material 181 from the opening 184 along with the removal of the anti-reflective coating material layer 189 is shown in FIG. 2B.

Figure 2B:
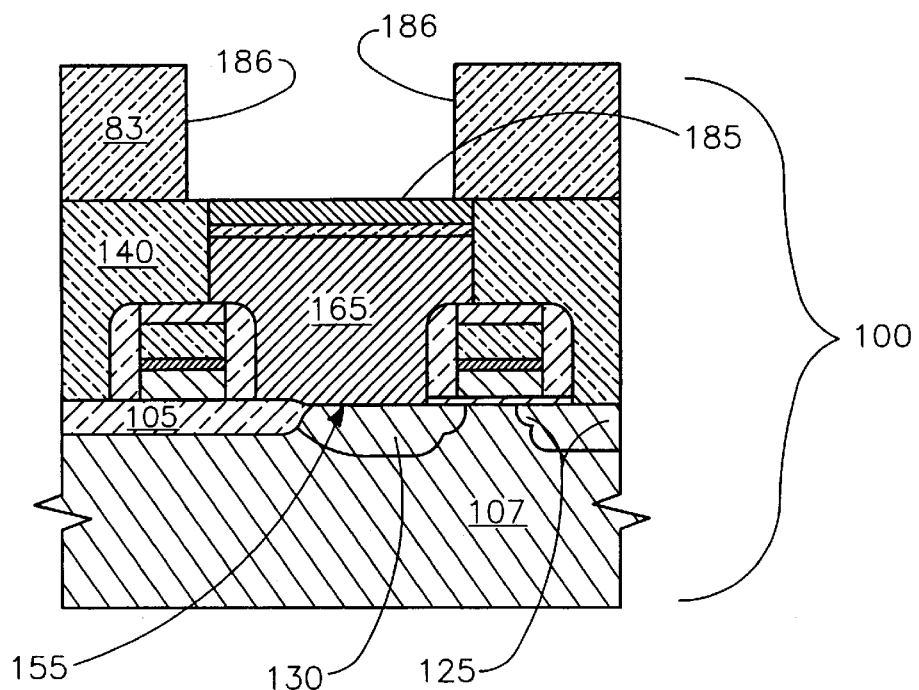
Figure 2C:
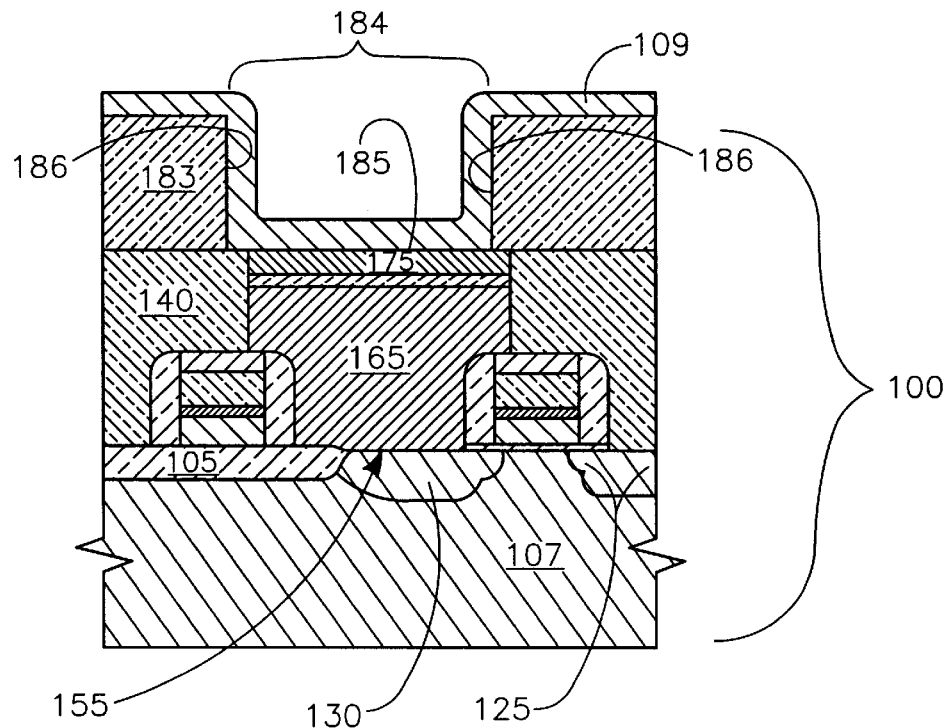
Figure 2D:
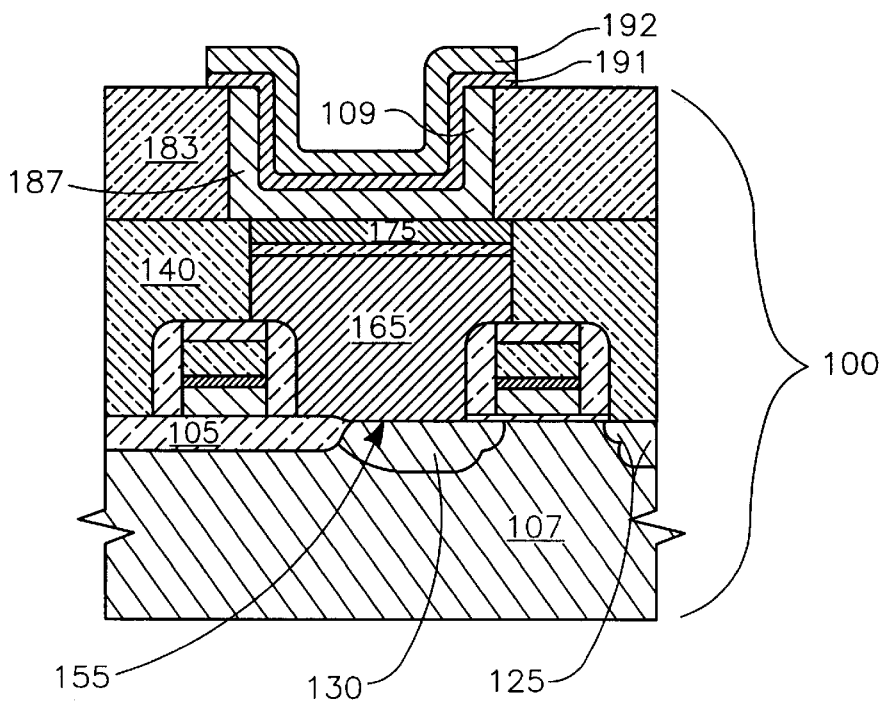

Thereafter, as shown in FIG. 2C, a bottom electrode material 109 is provided over the structure shown in FIG. 2B. The bottom electrode material layer 109 is then planarized resulting in the bottom electrode structure 187 shown in FIG. 2D. Thereafter, also as shown in FIG. 2D, a dielectric layer 191 is then formed relative to the bottom electrode structure 187. For example, the dielectric layer may be any suitable material having a suitable dielectric constant such as $Ba_xSr_{(1-x)}TiO_3$[BST], $BaTiO_3$, $SrTiO_3$, $PbTiO_3$, $Pb(Zr,Ti)O_3$[PZT], $(Pb,La)(Zr,Ti)O_3$[PLZT], $(Pb,La)TiO_3$[PLT], $KNO_3$, and $LiNbO_3$. Further, thereafter, a top electrode 192 is formed relative to the dielectric material 191. The second electrode or top electrode 192 may be formed of any particular material, such as tungsten nitride, titanium nitride, or any other suitable conductive material.

It will be recognized by one skilled in the art that any capacitor formed in an opening which is defined using an anti-reflective coating material layer that is required to be removed may benefit from use of the present invention. For example, such a container capacitor storage cell is described in U.S. Pat. No. 5,270,241 to Denison et al., entitled "Optimized Container Stacked Capacitor DRAM Cell Utilizing Sacrificial Oxide Deposition and Chemical Mechanical Polishing," issued Dec. 14, 1993.

Figure 3A:
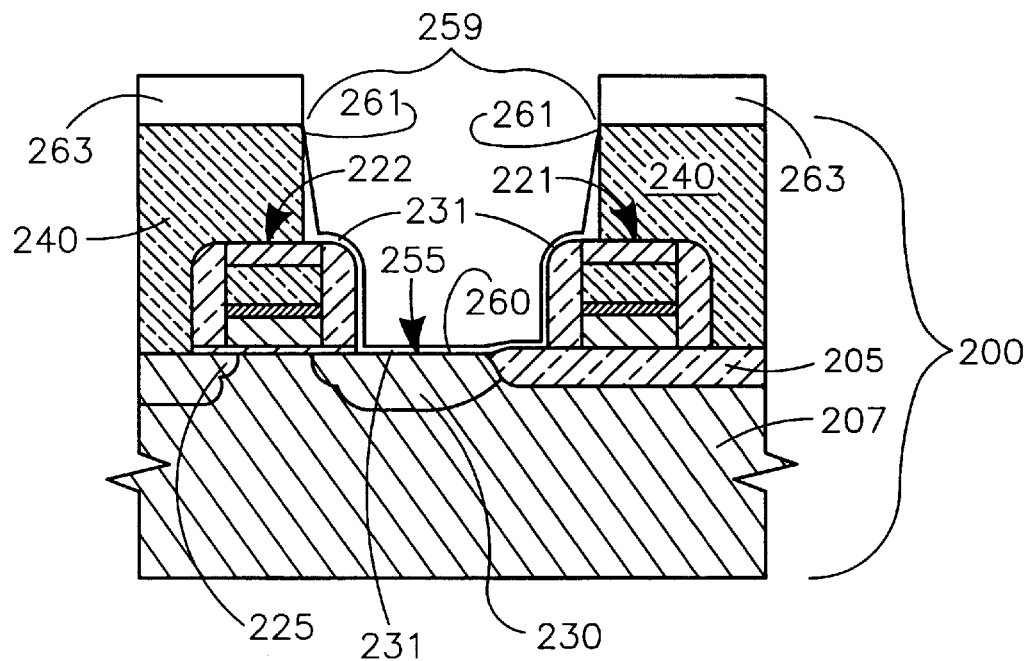
FIGS. 3A–3D generally illustrate a process of forming a contact in an opening defined using an anti-reflective material layer; the anti-reflective material layer being removed during the process.

As shown in FIG. 3A, device structure 200 is fabricated according to the present invention. The definition of contact opening 259 prior to metalization of the exposed contact area 255 of substrate 207 is performed using an anti-reflective coating material layer 263 according to the present invention. The device structure 200 includes field oxide regions 205 and active areas (i.e., those regions of substrate 207 not covered by field oxide). Formed relative to field oxide regions 205 and the active areas are word line 221 and field effect transistor 222. Suitably doped source/drain regions 225, 230 are formed as known to one skilled in the art. A conformal layer of oxide material 240, e.g., rich BPSG, is formed thereover and contact opening 259 is defined therein to the exposed contact area 255 in doped region 230 of silicon substrate 207 using the anti-reflective coating material layer 263 and an already removed photoresist.

Figure 3B:
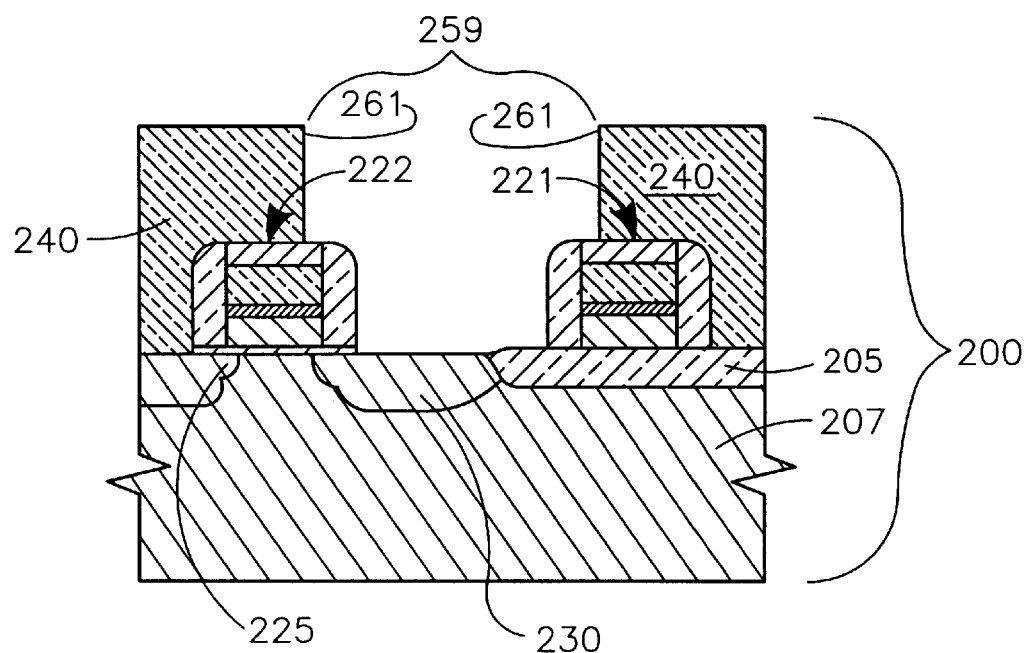
Figure 3C:
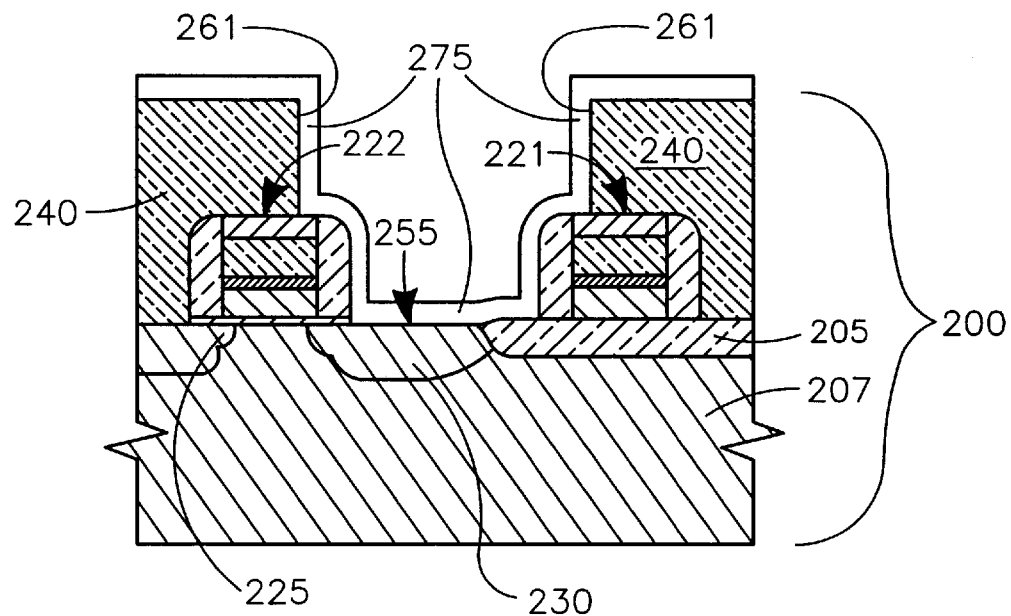
Figure 3D:
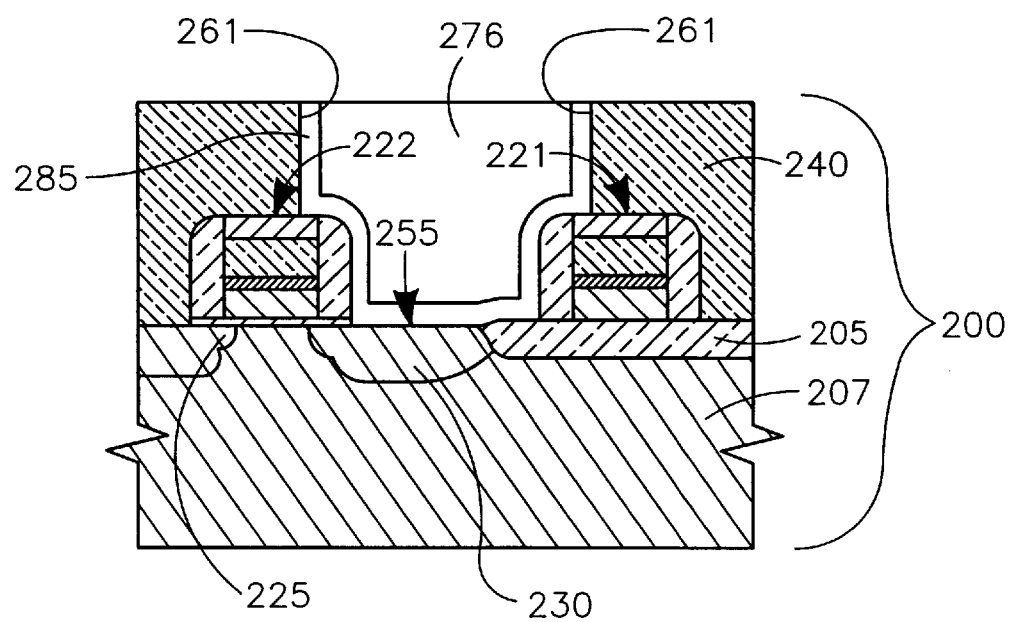

The structure shown in FIG. 3A is the resultant structure after etching of contact opening 259 using the anti-reflective coating material layer 263. Residue material 231 on the bottom surface 260 and walls 261 is required to be cleaned prior to subsequent processing. Such residue material 231 and the anti-reflective coating material layer 263 are simultaneously removed using a wet etchant such as one of the wet etchants previously described herein. The structure resulting from the cleaning of opening 259 and the simultaneous removal of anti-reflective coating material layer 263 is shown in FIG. 3B. Thereafter, one or more metalization or conductive layers are formed in the contact opening 259 for providing electrical connection to the substrate region 230. For example, various materials may be formed in the contact opening 259, such as titanium nitride or other diffusion barrier materials. For example, a barrier layer such as a tungsten nitride layer 275 may be deposited on the structure of FIG. 3B as shown in FIG. 3C. Thereafter, the tungsten nitride layer 275 may be planarized and a conductive material 276 may be formed in the contact opening for providing connection to doped region 230 of substrate 207 as shown in FIG. 3D.

All patents and references cited herein are incorporated in their entirety as if each were incorporated separately. This invention has been described with reference to illustrative embodiments and is not meant to be construed in a limiting sense. As described previously, one skilled in the art will recognize that various other illustrative applications may utilize the anti-reflective coating material layer as described herein such that removal of the anti-reflective coating material layer may be accomplished simultaneously with the cleaning of the structure of an integrated circuit according to the present invention. Various modifications of the illustrative embodiments, as well as additional embodiments of the invention, will be apparent to persons skilled in the art upon reference to this description.

What is claimed is:

1. A method of forming an anti-reflective coating material layer in the fabrication of integrated circuits, the method comprising:

providing a substrate assembly having a surface in a reaction chamber;

providing a gas mixture of at least a silicon containing precursor, a nitrogen containing precursor, and an oxygen containing precursor in the reaction chamber; and depositing an inorganic anti-reflective coating material layer on the substrate assembly surface using the gas mixture in the reaction chamber at a temperature in the range of about 50° C. to about 400° C., wherein depositing the inorganic anti-reflective coating material layer includes subjecting the gas mixture to a glow discharge created by applying an electromagnetic field across the gas mixture, and further wherein the inorganic anti-reflective coating material layer is $Si_xO_yN_z:H$, where x is in the range of about 0.39 to about 0.65, y is in the range of about 0.02 to about 0.56, z is in the range of about 0.05 to about 0.33, and where the atomic percentage of hydrogen in the inorganic anti-reflective coating material layer is in the range of about 10 atomic percent to about 40 atomic percent.

2. The method according to claim 1, wherein the silicon containing precursor is $SiH_4$, and further wherein the nitrogen containing precursor and oxygen containing precursor is $N_2O$.

3. The method according to claim 2, wherein providing the gas mixture includes providing a total flow of $SiH_4$ in a range of about 80 sccm to about 400 sccm.

4. The method according to claim 3, wherein providing the gas mixture includes providing a total flow of $SiH_4$ in a range of about 150 sccm to about 400 sccm.

5. The method according to claim 3, wherein providing the gas mixture includes providing a total flow of $SiH_4$ in a range of about 80 sccm to about 400 sccm.

6. A method of forming an anti-reflective coating material layer in the fabrication of integrated circuits, the method comprising:

providing a substrate assembly having a surface in a reaction chamber;

providing a gas mixture of at least a silicon containing precursor, a nitrogen containing precursor, and an oxygen containing precursor in the reaction chamber, wherein the silicon containing precursor is $SiH_4$, wherein the nitrogen containing precursor and oxygen containing precursor is $N_2O$, wherein providing the gas mixture includes providing a total flow of $SiH_4$ in a range of about 80 sccm to about 400 sccm, and further wherein providing the gas mixture further includes providing a flow of $N_2O$ in a range such that the ratio of the total flows of $SiH_4:N_2O$ is in a range of about 0.60 ; and depositing an inorganic anti-reflective coating material layer on the substrate assembly surface using the gas mixture in the reaction chamber at a temperature in the range of about 50° C. to about 400° C., wherein depositing the inorganic anti-reflective coating material layer includes subjecting the gas mixture to a glow discharge created by applying an electromagnetic field across the gas mixture, wherein the inorganic anti-reflective coating material layer is $Si_xO_yN_z:H$, where x is in the range of about 0.39 to about 0.65, y is in the range of about 0.02 to about 0.56, z is in the range of about 0.05 to about 0.33, and where the atomic percentage of hydrogen in the inorganic anti-reflective coating material layer is in the range of about 10 atomic percent to about 40 atomic percent, and further wherein depositing the inorganic anti-reflective coating material layer includes depositing the inorganic anti-reflective coating material layer at a deposition pressure in a range of about 3.5 torr to about 6.5 torr, and further wherein the glow discharge is created by applying a radio frequency electromagnetic field of 13.56 megahertz at a power density of about 50 W/cm$^2$ to about to about 500 W/cm$^2$.

7. The method of claim 2, wherein providing the gas mixture further includes providing an additional nitrogen containing precursor.

8. The method of claim 2, wherein providing the gas mixture further includes providing an inert dilution gas in the reaction chamber.

9. The method of claim 1, wherein the temperature is in the range of about 200° C. to about 400° C.

10. A method of forming an anti-reflective coating material layer in the fabrication of integrated circuits, the method comprising:

providing a substrate assembly having a surface in a reaction chamber;

providing a gas mixture of at least a silicon containing precursor, a nitrogen containing precursor, and an oxygen containing precursor in the reaction chamber; and depositing an inorganic anti-reflective coating material layer on the substrate assembly surface using the gas mixture in the reaction chamber at a temperature in the range of about 50° C. to about 400° C., wherein depositing the inorganic anti-reflective coating material layer includes subjecting the gas mixture to a glow discharge created by applying an electromagnetic field across the gas mixture, wherein the inorganic anti-reflective coating material layer is $Si_xO_yN_z$:H, where x is in the range of about 0.39 to about 0.65, y is in the range of about 0.02 to about 0.56, z is in the range of about 0.05 to about 0.33, and where the atomic percentage of hydrogen in the inorganic anti-reflective coating material layer is in the range of about 10 atomic percent to about 40 atomic percent, and further wherein depositing the anti-reflective coating material layer comprises depositing an anti-reflective coating material layer having an index of refraction in a range of about 1.7 to about 2.7 and an absorptive coefficient in a range of about 0.01 to about 1.5 at a wavelength of 248 nanometers or 365 nanometers.

11. The method of claim 1, wherein the silicon containing precursor is disilane.

12. A method of forming an anti-reflective coating material layer in the fabrication of integrated circuits, the method comprising:

providing a substrate assembly having a surface in a reaction chamber;

providing a gas mixture of at least $SiH_4$ and $N_2O$ in the reaction chamber, wherein providing the gas mixture includes providing a total flow of $SiH_4$ in a range of about 150 sccm to about 400 sccm; and depositing the inorganic anti-reflective coating material layer on the substrate assembly surface in the reaction chamber, wherein the deposition includes subjecting the gas mixture to a glow discharge created by applying an electromagnetic field across the gas mixture.

13. The method of claim 12, wherein the total flow of $SiH_4$ is in the range of about 200 sccm to about 350 sccm.

14. The method of claim 12, wherein the temperature of the surface is maintained in the range of about 50° C. to about 600° C.

15. The method of claim 12, wherein providing the gas mixture further includes providing a flow of $N_2O$ in a range such that the ratio of the total flows of $SiH_4$:$N_2O$ is in a range of about 0.60 to about 0.25.

16. The method of claim 12, wherein depositing the inorganic anti-reflective layer includes depositing the inorganic anti-reflective layer at a deposition pressure in a range of about 3.5 torr to about 6.5 torr, and further wherein the glow discharge is created by applying a radio frequency electromagnetic field of 13.56 megahertz at a power density of about 50 W/cm$^2$ to about 500 W/cm$^2$.

17. The method of claim 12, wherein depositing the inorganic anti-reflective coating material layer comprises depositing an anti-reflective coating material layer having an index of refraction in a range of about 1.7 to about 2.7 and an absorptive coefficient in a range of about 0.01 to about 1.5 at a wavelength of 248 nanometers or 365 nanometers.

18. The method of claim 12, wherein the inorganic anti-reflective coating material layer is $Si_xO_yN_z$:H, where x is in the range of about 0.39 to about 0.65, y is in the range of about 0.02 to about 0.56, z is in the range of about 0.05 to about 0.33, and where the atomic percentage of hydrogen in the inorganic anti-reflective coating material layer is in a range of about 10 atomic percent to about 40 atomic percent.

19. The method of claim 12, wherein providing the gas mixture further includes providing an additional nitrogen containing precursor in the reaction chamber.

20. The method of claim 12, wherein providing the gas mixture further includes providing an inert dilution gas in the reaction chamber.

* * * * *

UNITED STATES PATENT AND TRADEMARK OFFICE
CERTIFICATE OF CORRECTION

PATENT NO.      : 6,294,459 B1
DATED           : September 25, 2001
INVENTOR(S)     : Yin et al.

It is certified that error appears in the above-identified patent and that said Letters Patent is hereby corrected as shown below:

<u>Title page,</u>
Item [56], U.S. PATENT DOCUMENTS, please insert
-- 5,677,111    10/1997    Ogawa --;
-- 5,698,352    12/1997    Ogawa et al. --;
-- 5,766,964    06/1998    Rohatgi et al. --;
-- 5,796,151    08/1998    Hsu et al. --;
-- 5,886,391    03/1999    Niroomand et al. --;
-- 5,994,217    11/1999    Ng --;
-- 6,174,590 B1 01/2001    Iyer et al. --;

FOREIGN PATENT DOCUMENTS, please insert -- 3-101147 09/1989 (JP) --;

OTHER PUBLICATIONS, please insert -- Dammel et al., "Dependence of Optical Constants of AZ®BARLi™ Bottom Coating on Bake Conditions," *SPIE, 3049*, 963-973 (1997) --.;

<u>Column 13,</u>
Line 10, please insert -- : -- following "oxide";

<u>Column 16,</u>
Line 5, please delete "a total flow of $SiH_4$ in a range of about 80 sccm to about 400 sccm." and insert -- a flow of $N_2O$ in a range that the ratio of the total flows of $SiH_4$: $N_2O$ is in a range of about 0.25 to about 0.60. -- following "providing";
Line 24, please delete "0.60 ; and" and insert -- 0.60 to about 0.25; and --;
Line 39, please delete "and further" following "40 atomic percent,".

Signed and Sealed this

Eighth Day of October, 2002

Attest:

Attesting Officer

JAMES E. ROGAN
*Director of the United States Patent and Trademark Office*